(12) United States Patent
Tachikawa et al.

(10) Patent No.: US 6,544,712 B1
(45) Date of Patent: *Apr. 8, 2003

(54) NEGATIVE WORKING RESIST COMPOSITION

(75) Inventors: Toshikazu Tachikawa, Kanagawa (JP); Fumitake Kaneko, Kanagawa (JP); Miwa Miyairi, Kanagawa (JP); Masakazu Kobayashi, Kanagawa (JP)

(73) Assignee: Tokyo Ohka Kogyo Co., Ltd., Kanegawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/425,369

(22) Filed: Oct. 22, 1999

(30) Foreign Application Priority Data

Oct. 24, 1998 (JP) .......................................... 10-320002

(51) Int. Cl.[7] ............................................... G03F 7/038
(52) U.S. Cl. ..................... 430/170; 430/270.1; 430/905
(58) Field of Search ............................... 430/170, 270.1, 430/905

(56) References Cited

U.S. PATENT DOCUMENTS

| | | | | | |
|---|---|---|---|---|---|
| 5,817,444 A | * | 10/1998 | Sato et al. | ................... | 430/155 |
| 5,908,730 A | * | 6/1999 | Nitta et al. | ................... | 430/170 |
| 5,945,248 A | * | 8/1999 | Nitta et al. | ................... | 430/170 |
| 5,948,589 A | * | 9/1999 | Sato et al. | ............... | 430/270.1 |
| 6,090,518 A | * | 7/2000 | Niinomi et al. | ............. | 430/170 |
| 6,171,749 B1 | * | 1/2001 | Tachikawa et al. | ......... | 430/170 |

* cited by examiner

*Primary Examiner*—John S. Chu
(74) *Attorney, Agent, or Firm*—Fish & Richardson P.C.

(57) ABSTRACT

The present invention provides a negative working resist composition comprising a diazosulfonic acid compound capable of generating an acid with irradiation of radiation and an organic amine compound. The negative working resist composition is excellent in sensitivity, resist pattern profile, and aging stability.

7 Claims, No Drawings

NEGATIVE WORKING RESIST COMPOSITION

FIELD OF THE INVENTION

This invention relates to a negative working resist material. More particularly, it relates to a negative working resist composition suitable to fine processing with radiations such as ultraviolet rays, far ultraviolet rays, excimer (e.g., KrF or ArF) laser beams, X-rays, and electron beams.

BACKGROUND OF THE INVENTION

In the manufacture of electronic components such as semiconductor devices and liquid crystal display devices, processing technology has recently gained in fineness. With this tendency, it has been demanded for the resist to be used to have higher resolution and higher sensitivity to form a resist pattern with a satisfactory profile. Under such circumstances, attention is paid to a chemically amplified resist in which reaction which changes the solubility of the resist in a developer is caused by catalysis of an acid generated with irradiation of radiation, and a number of chemically amplified negative working resist compositions are proposed.

Photolithography is adopted in manufacturing electronic components by use of the chemically amplified negative working resist composition. That is, a chemically amplified negative working resist is applied to a substrate, such as a silicon wafer, irradiated with a radiation through a mask pattern, and developed to form a resist pattern. The substrate is then etched with the resist pattern as a protective film.

There is a tendency in the photolithography to use radiations having short wavelengths, such as UV rays, deep UV rays, and excimer (e.g., KrF or ArF) laser beams. Use of electron rays and X-rays has also been studied intensively. In order for a chemically amplified negative working resist composition to be sensitive to such short-wavelength radiations to form a satisfactory resist pattern, it is important that each component making up the resist composition shows small absorption of the radiation. From this viewpoint, novolak resins that have been used conventionally are impractical because of their large radiation absorption, and polyvinylphenol resins having a small radiation absorption have come to be used.

Chemically amplified negative working resist compositions containing a polyvinylphenol resin as a resinous component are disclosed in JP-A-1-293339, JP-A-2-15270, and JP-A-4-163552, but any of them has insufficient resolution. To improve resolution, JP-A-7-238196 proposes to use, as an alkali-soluble resin, a 4-hydroxystyrene-styrene copolymer having a styrene content of 5 to 20 mol % and a weight average molecular weight of 6000 to 25,000.

However, the resist pattern formed of the chemically amplified resist composition according to JP-A-7-238196 is inferior in contrast, and its profile is not satisfactory. In order to overcome these disadvantages, JP-A-7-295220 teaches a chemically amplified negative working photoresist composition comprising an alkali-soluble resin containing at least one of partially alkyl etherified polyvinylphenol and partially alkyl etherified hydrogenated polyvinylphenol, a photosensitive acid generator containing at least one sulfonic ester of an N-hydroxyimide compound, and a crosslinking agent. While this composition exhibits improved resolution and an improved profile, the resist characteristics are liable to change with time, which has been a great problem in practical use.

SUMMARY OF THE INVENTION

Accordingly, an object of the invention is to provide a practical negative working resist composition which is excellent in resolution, profile, and aging stability.

In the light of the above-described circumstances, the present inventors have conducted extensive investigations. As a result, they have found that a diazosulfonic acid compound capable of generating an acid upon irradiation of radiation and an organic amine compound provide a negative working resist composition which exhibits excellent resolution, forms a resist film with an excellent profile and undergoes no change in characteristics with time (hereinafter referred to as aging stability).

The above object is accomplished by a negative working resist composition essentially comprising (A) a diazosulfonic acid compound capable of generating an acid with irradiation of radiation and (B) an organic amine compound.

DETAILED DESCRIPTION OF THE INVENTION

If desired, the negative working resist composition of the invention can further comprise (C) an organic carboxylic acid compound.

The components (A) and (B) or the components (A) to (C) can be combined with (D) an alkali-soluble resin and (E) a compound capable of causing crosslinking reaction in the presence of an acid (hereinafter referred to as a crosslinking agent) to provide a chemically amplified negative working resist composition capable of forming a resist pattern excellent in resolution and profile.

The diazosulfonic acid compound as component (A) includes those known as an acid generator to be used in negative working resists, such as compounds represented by formula (I):

wherein $R^1$ represents a branched or cyclic alkyl group having 3 to 8 carbon atoms; and $R^2$ represents a straight-chain, branched or cyclic alkyl group having 1 to 8 carbon atoms, and the compounds described in JP-A-4-217249. Specific examples of useful diazosulfonic acid compounds are bis(cyclohexylsulfonyl)diazomethane, cyclohexylsulfonylethyl-sulfonyldiazomethane, bis(isopropylsulfonyl)diazomethane, bis(t-butylsulfonyl) diazomethane, bis(sec-butylsulfonyl)-diazomethane, t-butylsulfonylmethylsulfonyldiazomethane, t-butylsulfonylcyclohexylsulfonyldiazomethane, bis (cyclopentylsulfonyl)diazomethane, cyclopentylsulfonyl-t-butylsulfonyldiazomethane, and bis(iso-amylsulfonyl) diazomethane.

The organic amine compound as component (B) includes aliphatic amines, aromatic amines, and heterocyclic amines.

Specific examples of the aliphatic amines are monoethanolamine, triethanolamine, methylamine, ethylamine, propylamine, isopropylamine, butylamine, isobutylamine, t-butylamine, pentylamine, isopentylamine, t-pentylamine, hexylamine, heptylamine, octylamine, dimethylamine, diethylamine, dipropylamine, diisopropylamine, trimethylamine, triethylamine, tripropylamine, triisopropylamine, tributylamine, triisobutylamine, tri(t-butyl)amine, tripentylamine, triisopentylamine, tri(t-pentyl)amine, trihexylamine, triheptylamine, and trioctylamine. Specific examples of the aromatic amines are benzylamine, aniline, N-methylaniline, N,N-dimethylaniline, o-methylaniline, m-methylaniline, p-methylaniline, N,N-diethylaniline, and diphenylamine. Specific examples of the heterocyclic amines include pyridine, o-methylpyridine, o-ethylpyridine, 2,3-dimethylpyridine, 4-ethyl-2-methylpyridine, and 3-ethyl-4-methylpyridine. Preferred of them are aliphatic amines. In particular, trimethylamine, triethylamine, tripropylamine, triisopropylamine, tributylamine, triisobutylamine, tri(t-butyl)amine, tripentylamine, triisopentylamine, tri(t-pentyl) amine, trihexylamine, triheptylamine, and trioctylamine are still preferred for forming a resist pattern excellent in resolution and profile.

The diazosulfonic acid compound is used generally in an amount of 0.5 to 30 parts by weight, and the organic amine compound is used in an amount of 0.01 to 5 parts by weight, both per 100 parts by weight of the total composition. Added in smaller amounts, components (A) and (B) bring about insubstantial improvement on profile and aging stability. If added in higher amounts, they hardly dissolve in a solvent completely and have poor miscibility with the resinous component.

The organic carboxylic acid compound which can be used as component (C) is not particularly limited and includes saturated or unsaturated aliphatic carboxylic acids, alicyclic carboxylic acids, hydroxycarboxylic acids, alkoxycarboxylic acids, ketocarboxylic acids, aromatic carboxylic acids, and the like. Incorporation of component (C) brings about further improvement on aging stability.

Examples of suitable organic carboxylic acid compounds include aliphaticmono- or polycarboxylic acids, such as formic acid, acetic acid, propionic acid, butyric acid, isobutyric acid, oxalic acid, malonic acid, succinic acid, glutaric acid, and adipic acid; alicyclic carboxylic acids, such as 1,1-cyclohexanedicarboxylic acid, 1,2-cyclohexanedicarboxylic acid, 1,3-cyclohexanedicarboxylic acid, 1,4-cyclohexanedicarboxylic acid, and 1,1-cyclohexyldiacetic acid; unsaturated aliphatic carboxylic acids, such as acrylic acid, crotonic acid, isocrotonic acid, 3-butenoic acid, methacrylic acid, 4-pentenoic acid, acetylene carboxylic acid (e.g., propiolic acid and 2-butynedioic acid), maleic acid, and fumaric acid; hydroxycarboxylic acids, such as hydroxyacetic acid; alkoxycarboxylic acids, such as methoxyacetic acid and ethoxyacetic acid; ketocarboxylic acids, such as pyruvic acid; and aromatic carboxylic acids, such as p-hydroxybenzoic acid, o-hydroxybenzoic acid, 2-hydroxy-3-nitrobenzoic acid, 3,5-dinitrobenzoic acid, 2-nitrobenzoic acid, 2,4-dihydroxybenzoic acid, 2,5-dihydroxybenzoic acid, 2,6-dihydroxybenzoic acid, 3,4-dihydroxybenzoic acid, 3,5-dihydroxybenzoic acid, 2-vinylbenzoic acid, 4-vinylbenzoic acid, phthalic acid, terephthalic acid, and isophthalic acid. Benzoic acids having a substituent on the ortho position, e.g., o-hydroxybenzoic acid, o-nitrobenzoic acid, and phthalic acid, are particularly suitable.

The organic carboxylic acid compound is generally used in an amount of 0.01 to 1% by weight, preferably 0.05 to 0.5% by weight, based on the total composition. If the amount of the organic carboxylic acid compound is less than 0.01% by weight, there is a possibility that a resist pattern having good profile can not be obtained. If it is more than 1% by weight, developability may be reduced.

The alkali-soluble resin as component (D) which can be used in the chemically amplified negative working resist composition of the invention includes phenol novolak resins, cresol novolak resins, polyacrylic acid, polyvinyl alcohol, styrene-maleic anhydride copolymers, and polyhydroxystyrene and derivatives thereof. The polyhydroxystyrene and derivatives thereof include a homopolymer of vinylphenol, a copolymer of vinylphenol with an acrylic acid derivative, acrylonitrile, a methacrylic acid derivative, methacrylonitrile, styrene, or a styrene derivative (e.g., α-methylstyrene, p-methylstyrene, o-methylstyrene, p-methoxystyrene or p-chlorostyrene), a hydrogenated vinylphenol homopolymer, a hydrogenated copolymer of vinylphenol and the above-described acrylic acid derivative, methacrylic acid derivative or styrene derivative, and polyhydroxystyrene having the hydrogen of the hydroxyl groups thereof partly substituted with a protective group.

of these alkali-soluble resins, polyhydroxystyrene having the hydrogen of the hydroxyl groups thereof partly substituted with a protective group is preferred. Still preferred is a hydroxystyrene-styrene copolymer having the hydrogen of the hydroxyl groups thereof partly substituted with a protective group. The protective group includes a straight-chain or branched lower alkyl group, a t-butoxycarbonyl group, a t-aminoxycarbonyl group, an ethoxyethyl group, a methoxypropyl group, a tetrahydropyranyl group, a tetrahdrofuranyl group, a benzyl group, and a trimethylsilyl group. Polyhydroxystyrene or a hydroxystyrene-styrene derivative copolymer having their hydroxyl groups partly protected with a lower alkyl group, especially a straight-chain or branched alkyl group having 1 to 4 carbon atoms, e.g., a methyl, ethyl, n-propyl, isopropyl or n-butyl group, is particularly preferred for their capability of forming a resist pattern with high resolution. It is preferred that the degree of substitution with the protective group is 1 to 25 mol %.

The crosslinking agent which can be used as component (E) is not particularly limited, and any conventional crosslinking agent is employable. Examples of suitable crosslinking agents include amino resins having a hydroxyl group or an alkoxy group, such as methoxymethylated melamine resins, ethoxymethylated melamine resins, propoxymethylated melamine resins, butoxymethylated melamine resins, and methoxymethylurea resins, benzene compounds having an alkoxy group, phenolic compounds having a hydroxyl group or an alkoxy group, and the compounds described in JP-A-4-215668 and JP-A-7-306531. Commercially available amino resin crosslinking agents, such as a series of alkoxymethylated melamine resins produced by Sanwa Chemical Co., Ltd. and sold under a trade name Nikalac (e.g., MX-750, MX-706, MX-101, MX-032, MX-708, MX-40, MX-31, MS-11, MW-22, and MW-30) and a series of alkoxymethylated urea resins produced by Sanwa Chemical Co., Ltd. and sold under a trade name Nikalac (e.g., MX-290 and N-2009), can be made use of.

Component (E) is suitably used in a proportion of 0.5 to 20 parts by weight per 100 parts by weight of component (D). If the proportion of component (E) is less than 0.5 part, the resulting resist film is liable to have insufficient strength. If added in an excessive amount, component (E) tends to deteriorate the resolution.

If desired, the negative working resist composition of the invention can contain a light absorber. Light absorbers useful in the invention include a naphthoquinone-1,2-diazido-5-sulfonic acid ester of a polyphenol (e.g., 1-[1-(4-hydroxyphenyl) isopropyl]-4-[1,1-bis(4-hydroxyphenyl) ethyl]benzene or bis(4-hydroxy-3,5-dimethylphenyl)-3,4-dihydroxyphenylmethane), benzophenone, 2,2',4,4'-tetrahydroxybenzophenone, 2,3,3',4,4',5'-hexahydrobenzophenone, 4-dimethylamino-2',4'-dihydroxybenzophenone, 5-amino-3-methyl-1-phenyl-4-(4-hydroxyphenylazo)pyrazole, 4-dimethylamino-4'-hydroxyazobenzene, 4-diethylamino-4'-ethoxyazobenzene, 4-diethylaminoazobenzene, and curcumin.

Addition of the light absorber is effective in improving sensitivity and resolution and forming a resist pattern having not a wavy but a rectangular profile. The light absorber is usually added in an amount of 0.5 to 15 parts by weight per 100 parts by weight of the total composition. If it is added in amounts exceeding 15 parts, the profile is deteriorated.

If desired, the negative working resist composition of the invention can further contain other miscible additives for improving the performance of a resist film, such as additional resins, plasticizers, stabilizers, colorants, surface active agents, and coupling agents (e.g., hexamethyldisilazane) in amounts that do not impair the performance of the composition.

The negative working resist composition is preferably used in the form of a solution in a solvent. Suitable solvents include ketones, such as acetone, methyl ethyl ketone, cyclohexanone, methyl isoamyl ketone, and 2-heptanone; polyhydric alcohols and derivatives thereof, such as ethylene glycol, ethylene glycol monoacetate, diethylene glycol, diethylene glycol monoacetate, propylene glycol, propylene glycol monoacetate, dipropylene glycol, and monomethyl ether, monoethyl ether, monopropyl ether, monobutyl ether or monophenyl ether of dipropylene glycol monoacetate; cyclic ethers, such as dioxane; and esters, such as methyl lactate, ethyl lactate, methyl acetate, ethyl acetate, butyl acetate, methyl pyruvate, ethyl pyruvate, methyl methoxypropionate, and ethyl ethoxypropionate. These solvents may be used either individually or as a mixture of two or more thereof.

In the practice, a solution of the negative working resist composition in a solvent is applied to a substrate, such as a silicon wafer or a glass plate, by a conventional coating method, such as spin coating, and dried to form a resist film. The resist film is exposed to UV rays, deep UV rays or excimer laser light from a demagnification projection aligner through a desired mask pattern or exposed imagewise by means of an electron beam lithography system, heated and developed with a developer to form a resist pattern. Development is carried out by, for example, dipping in an aqueous alkali solution such as a 1 to 10 wt % aqueous solution of tetramethylammonium hydroxide to selectively dissolve and remove the unexposed area.

The invention will now be illustrated in greater detail with reference to Examples, but it should be understood that the invention is not construed as being limited thereto.

In Examples, the profile of patterned resists and the aging stability of resist compositions were evaluated according to the following standards.

| Profile | |
| --- | --- |
| Good | rectangular |
| Poor | round-topped |
| Aging Stability | |
| Good | No change is observed between the sensitivity measured immediately after preparation and that measured after standing at room temperature for 3 months |
| Poor | Change is observed between the sensitivity measured immediately after preparation and that measured after standing at room temperature for 3 months |

EXAMPLE 1

A polyhydroxystyrene resin (weight average molecular weight (Mw): 4400) obtained by copolymerizing p-hydroxystyrene and styrene at a molar ratio of 95:5 and substituting 10 mol % of the hydrogen of its hydroxyl groups with a propyl group was used as component (D), an alkali-soluble resin. The alkali-soluble resin (100 g), 8 g of an alkoxymethylated melamine resin (Nikalac MW-30, produced by Sanwa Chemical Co., Ltd.), 2 g of an alkoxymethylated urea resin (Nikalac MX-290, produced by Sanwa Chemical Co., Ltd.), 7 g of bis(cyclohexylsulfonyl) diazomethane, 0.08 g of o-hydroxybenzoic acid, and 0.11 g of tributylamine were dissolved in 850 g of a mixed solvent of propylene glycol monomethyl ether and propylene glycol monomethyl ether acetate at a weight ratio of 70/30 to prepare a negative working resist solution.

The resist solution was applied to a silicon wafer with a spinner and dried on a hot plate at 100° C. for 90 seconds to form a resist film having a thickness of 0.73 Am. The resist film was selectively irradiated with a KrF excimer laser by use of a demagnification projection aligner NSR-2005EX8A (Nikon Corp.), baked at 120° C. for 90 seconds, developed with a 2.38 wt % aqueous solution of tetramethylammonium hydroxide at 23° C. for 65 seconds, rinsed with water for 30 seconds, and dried to form a negative resist pattern.

The resulting resist pattern was a 0.16 $\mu$m wide line-and-space image. On SEM (scanning electron microscope) observation, the resist pattern had a rectangular profile perpendicular to the substrate. The sensitivity of the resist was 40 mJ/cm$^2$.

The aging stability of the resist was evaluated by comparing the performance of the resist solution immediately after the preparation in terms of resolution, profile, and sensitivity and that after allowing the resist solution to stand at room temperature for 3 months. As a result, no change was observed after 3 months' standing, indicating satisfactory aging stability.

EXAMPLES 2 TO 8 AND COMPARATIVE EXAMPLES 1 TO 3

A resist pattern was formed in the same manner as in Example 1, except for using the components (A) to (E) shown in Table 1 below. The results of evaluation on resolution, profile, and aging stability are shown in Table 1.

TABLE

| | Component* (g) | | | | | Evaluation | | |
|---|---|---|---|---|---|---|---|---|
| | A | B | C | D | E | Resolution (μm) | Profile | Aging Stability |
| Example 2 | A-2 (7) | B-1 (0.11) | C-1 (0.08) | D-1 (100) | E-1 (8) E-2 (2) | 0.16 | good | good |
| Example 3 | A-1 (7) | B-1 (0.11) | C-1 (0.08) | D-2 (100) | E-1 (8) E-2 (2) | 0.16 | good | good |
| Example 4 | A-1 (7) | B-1 (0.11) | C-1 (0.08) | D-3 (100) | E-1 (8) E-2 (2) | 0.16 | good | good |
| Example 5 | A-1 (7) | B-1 (0.11) | C-1 (0.08) | D-4 (100) | E-1 (8) E-2 (2) | 0.20 | good | good |
| Example 6 | A-1 (7) | B-1 (0.11) | C-1 (0.08) | D-5 (100) | E-1 (8) E-2 (2) | 0.20 | good | good |
| Example 7 | A-1 (7) | B-2 (0.11) | C-2 (0.08) | D-1 (100) | E-1 (8) E-2 (2) | 0.16 | good | good |
| Example 8 | A-1 (7) | B-1 (0.11) | C-3 (0.08) | D-1 (100) | E-1 (8) E-2 (2) | 0.16 | good | good |
| Compara. Example 1 | A-1 (7) | — | — | D-1 (100) | E-1 (8) E-2 (2) | 0.22 | poor | good |
| Compara. Example 2 | A-1 (7) | — | C-1 (0.08) | D-1 (100) | E-1 (8) E-2 (2) | 0.20 | good | poor |
| Compara. Example 3 | A-3 (7) | B-1 (0.11) | C-1 (0.08) | D-1 (100) | E-1 (8) E-2 (2) | 0.18 | good | poor |

*A-1: Bis(cyclohexylsulfonyl)diazomethane
A-2: Bis(cyclopentylsulfonyl)diazomethane
A-3: N-Hydroxysuccinimidomethanesulfonic ester
B-1: Tributylamine
B-2: Triethylamine
C-1: o-Hydroxybenzoic acid
C-2: o-Nitrobenzoic acid
C-3: Phthalic acid
D-1: Polyhydroxystyrene resin (Mw: 4400) prepared by copolymerizing p-hydroxystyrene and styrene at a weight ratio of 95:5 and substituting 10 mol % of the hydrogen of the hydroxyl groups thereof with an n-propyl group.
D-2: Polyhydroxystyrene resin (Mw: 4400) prepared by copolymerizing p-hydroxystyrene and styrene at a weight ratio of 95:5 and substituting 20 mol % of the hydrogen of the hydroxyl groups thereof with an ethyl group.
D-3: Polyhydroxystyrene resin (Mw: 4400) prepared by copolymerizing p-hydroxystyrene and styrene at a weight ratio of 95:5 and substituting 10 mol % of the hydrogen of the hydroxyl groups thereof with an n-butyl group.
D-4: Polyhydroxystyrene resin (Mw: 4400) prepared by copolymerizing p-hydroxystyrene and styrene at a weight ratio of 95:5 and substituting 10 mol % of the hydrogen of the hydroxyl groups thereof with a t-butoxycarbonyl group.
D-5: Polyhydroxystyrene resin (Mw: 4400) prepared by copolymerizing p-hydroxystyrene and styrene at a weight ratio of 95:5 and substituting 10 mol % of the hydrogen of the hydroxyl groups thereof with an ethoxyethyl group.
E-1: Nikalac MW30 (alkoxymethylated melamine, produced by Sanwa Chemical Co., Ltd.)
E-2: Nikalac MX-290 (alkoxymethylated urea resin, produced by Sanwa Chemical Co., Ltd.)

The negative working resist composition according to the present invention exhibits high sensitivity, high resolution, and excellent aging stability and is capable of forming a resist pattern with a satisfactory profile.

While the invention has been described in detail and with reference to specific examples thereof, it will be apparent to one skilled in the art that various changes and modifications can be made therein without departing from the spirit and scope thereof.

What is claimed is:

1. A negative working resist composition comprising (A) either bis (cyclohexylsulfonyl) diazomethane or bis (cyclopentylsulfonyl) diazomethane, (B) an organic amine compound, (C) an organic carboxylic acid compound, (D) an alkali-soluble resin, and (E) a compound capable of causing crosslinking reaction in the presence of an acid.

2. The negative working resist composition according to claim 1, wherein said alkali-soluble resin is polyhydroxystyrene having the hydrogen of the hydroxyl groups thereof partly substituted with a protective group.

3. The negative working resist according to claim 1, wherein said alkali-soluble resin is a hydroxystyrene-styrene copolymer having the hydrogen of the hydroxyl groups thereof partly substituted with a protective group.

4. The negative working resist composition according to claim 2, wherein said protective group is a straight-chain or branched alkyl group having 1 to 4 carbon atoms.

5. The negative working resist composition according to claim 3, wherein said protective group is a straight-chain or branched alkyl group having 1 to 4 carbon atoms.

6. The negative working resist composition according to claim 2, wherein the degree of substitution with the protective group is 1 to 25 mol %.

7. The negative working resist composition according to claim 3, wherein the degree of substitution with the protective group is 1 to 25 mol %.

* * * * *